(12) United States Patent
Tseng et al.

(10) Patent No.: US 11,914,275 B2
(45) Date of Patent: Feb. 27, 2024

(54) PROJECTION DEVICE HAVING CASING WITH BAFFLE

(71) Applicant: Coretronic Corporation, Hsin-Chu (TW)

(72) Inventors: Jui-Cheng Tseng, Hsin-Chu (TW); Wen-Hao Chu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/380,028

(22) Filed: Jul. 20, 2021

(65) Prior Publication Data

US 2022/0365410 A1 Nov. 17, 2022

(30) Foreign Application Priority Data

May 12, 2021 (CN) .......................... 202121010542.9

(51) Int. Cl.
G03B 21/14 (2006.01)
G03B 21/16 (2006.01)
G03B 21/20 (2006.01)
H05K 7/20 (2006.01)

(52) U.S. Cl.
CPC ........... *G03B 21/145* (2013.01); *G03B 21/16* (2013.01); *G03B 21/204* (2013.01); *H05K 7/20145* (2013.01); *H05K 7/20154* (2013.01)

(58) Field of Classification Search
CPC ..... G03B 21/16; G03B 21/145; H04N 9/3144
See application file for complete search history.

(56) References Cited

U.S. PATENT DOCUMENTS

| 5,951,136 | A  | * | 9/1999  | Furuhata | H04N 9/3141 348/E5.143 |
| 7,581,840 | B2 | * | 9/2009  | Kim | G03B 21/142 359/825 |
| 7,819,536 | B2 | * | 10/2010 | Suzuki | G03B 21/145 362/362 |
| 8,313,200 | B2 | * | 11/2012 | Yen | G03B 21/145 353/57 |
| 9,664,987 | B2 | * | 5/2017  | Nomoto | G03B 21/16 |
| 11,474,421 | B2 | * | 10/2022 | Yamaki | H04N 9/3144 |

(Continued)

FOREIGN PATENT DOCUMENTS

| CN | 208188559 | 12/2018 |
| TW | 201104339 | 2/2011 |
| TW | 201600916 | 1/2016 |

*Primary Examiner* — Bao-Luan Q Le
(74) *Attorney, Agent, or Firm* — JCIPRNET

(57) ABSTRACT

Provided is a projection device, including a casing, a light source module, an optical engine module, a projection lens, and a fan. The casing includes a right cover plate and a baffle opposite to each other, and a lower cover plate adjacent to the right cover plate. The baffle divides the casing into first and second areas. The right and lower cover plates respectively have first and second air outlets adjacent to each other and located in the second area. The light source module, the optical engine module, located on a light transmission path of the light source module, the projection lens, connected to the optical engine module, and the fan, adjacent to the baffle, are disposed in the first area of the casing. The projection device is placed in a first or second state, and hot airflow therein flows out from the first or second air outlet.

20 Claims, 5 Drawing Sheets

(56) References Cited

U.S. PATENT DOCUMENTS

| | | | |
|---|---|---|---|
| 2002/0018183 A1* | 2/2002 | Ito | G03B 21/16 353/20 |
| 2006/0203211 A1* | 9/2006 | Kim | G03B 21/145 353/101 |
| 2006/0209267 A1* | 9/2006 | Hirosawa | G03B 21/16 353/58 |
| 2007/0242453 A1* | 10/2007 | Suzuki | G03B 21/16 362/345 |
| 2008/0055558 A1* | 3/2008 | Tang | G03B 21/006 353/33 |
| 2008/0055561 A1* | 3/2008 | Lv | G03B 21/16 353/57 |
| 2008/0055562 A1* | 3/2008 | Zhang | G03B 21/16 353/97 |
| 2008/0055570 A1* | 3/2008 | Kong | G03B 21/20 353/100 |
| 2008/0246896 A1* | 10/2008 | Zheng | H04N 9/3102 349/5 |
| 2008/0252859 A1* | 10/2008 | Nagahata | G03B 21/16 353/61 |
| 2009/0009727 A1* | 1/2009 | Osumi | G03B 21/16 353/54 |
| 2010/0026966 A1* | 2/2010 | Nakano | G03B 21/16 362/373 |
| 2011/0211171 A1* | 9/2011 | Yen | G03B 21/145 353/57 |
| 2011/0279789 A1* | 11/2011 | Gishi | H04N 9/3144 353/61 |
| 2014/0354958 A1* | 12/2014 | Tsuchitani | G03B 21/16 353/57 |
| 2016/0142688 A1* | 5/2016 | Nomoto | H04N 9/3144 353/54 |
| 2016/0330419 A1* | 11/2016 | Lin | H04N 9/3144 |
| 2018/0217481 A1* | 8/2018 | Hama | G03B 21/204 |
| 2018/0314139 A1* | 11/2018 | Chiu | G03B 21/145 |
| 2019/0171092 A1* | 6/2019 | Yamashita | G03B 21/145 |
| 2019/0250488 A1* | 8/2019 | Hirasawa | H04N 5/74 |
| 2020/0033706 A1* | 1/2020 | Iinuma | H04N 9/3141 |
| 2021/0191241 A1* | 6/2021 | Tian | G03B 21/00 |
| 2021/0302817 A1* | 9/2021 | Yamaki | H04N 9/3144 |

* cited by examiner

PROJECTION DEVICE HAVING CASING WITH BAFFLE

CROSS-REFERENCE TO RELATED APPLICATION

This application claims the priority benefit of China application serial no. 202121010542.9, filed on May 12, 2021. The entirety of the above-mentioned patent application is hereby incorporated by reference herein and made a part of this specification.

BACKGROUND

Technical Field

The disclosure relates to a projection device, and more particularly to a projection device having better heat dissipation performance.

Description of Related Art

When the projection device is used for projection, the placement state of the projection device can be changed to adapt to different projection environments. At present, the projection device often requires an external mounting part to increase its distance from the desktop where it is placed during vertical projection, or requires to keep a certain distance between its air outlet and the desktop, in order to ensure that the air outlet is not obstructed and does not cause hot air to circulate and continuously heat elements in the projection device. If the distance between the air inlet and outlet of the system and the desktop cannot be increased, the air inlet and outlet of the projection device may be blocked by the desktop, thereby affecting the flow direction of cooling airflow in the projection device and rendering the cold air unable to be drawn into the projection device or the hot air unable to be smoothly discharged out of the projection device after cooling the elements. However, the requirement of an external mounting part to support the projection device and the restriction of no obstacles within a certain distance from the air inlet and outlet both greatly limit the convenience of the projection device during vertical projection.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a projection device having good heat dissipation performance in various placement states, and may be flexibly applied in various situations.

Other objectives and advantages of the disclosure may be further understood from the technical features disclosed herein.

In order to achieve one or a part or all of the above or other objectives, an embodiment of the disclosure provides a projection device including a casing, a light source module, an optical engine module, a projection lens, and a fan. The casing includes a right cover plate and a baffle opposite to each other, and a lower cover plate adjacent to the right cover plate. The baffle divides the casing into a first area and a second area. The right cover plate has a first air outlet, and the lower cover plate has a second air outlet. The first air outlet and the second air outlet are adjacent to each other and are located in the second area. The light source module, the optical engine module, the projection lens, and the fan are disposed in the first area of the casing. The optical engine module is located on a light transmission path of the light source module. The projection lens is connected to the optical engine module, and the fan is adjacent to the baffle. The projection device is configured to be placed in one of the first state and the second state, and hot airflow in the projection device is configured to flow out from one of the first air outlet and the second air outlet.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
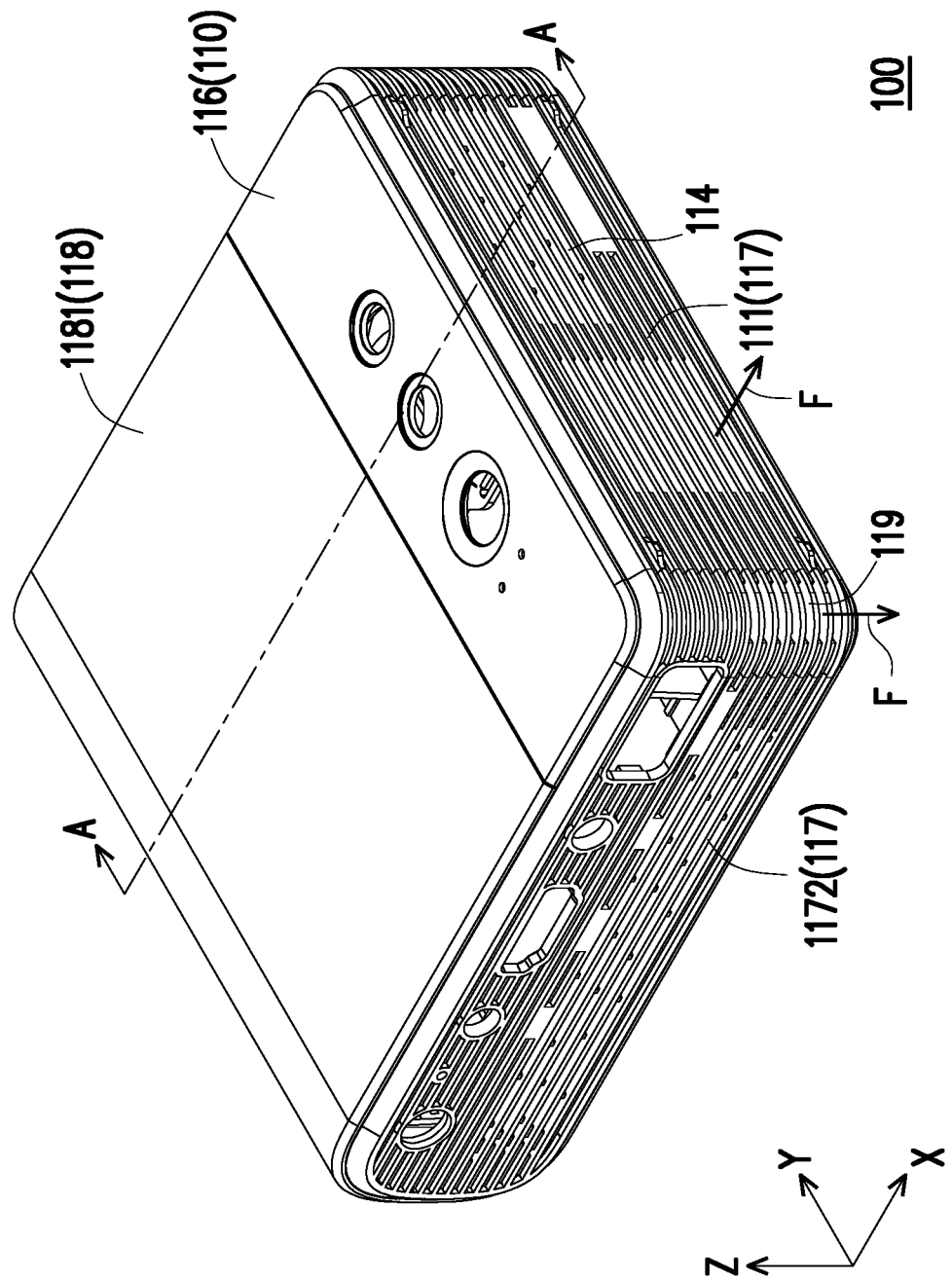
FIG. 1 is a perspective view of a projection device according to an embodiment of the disclosure.
Figure 2:
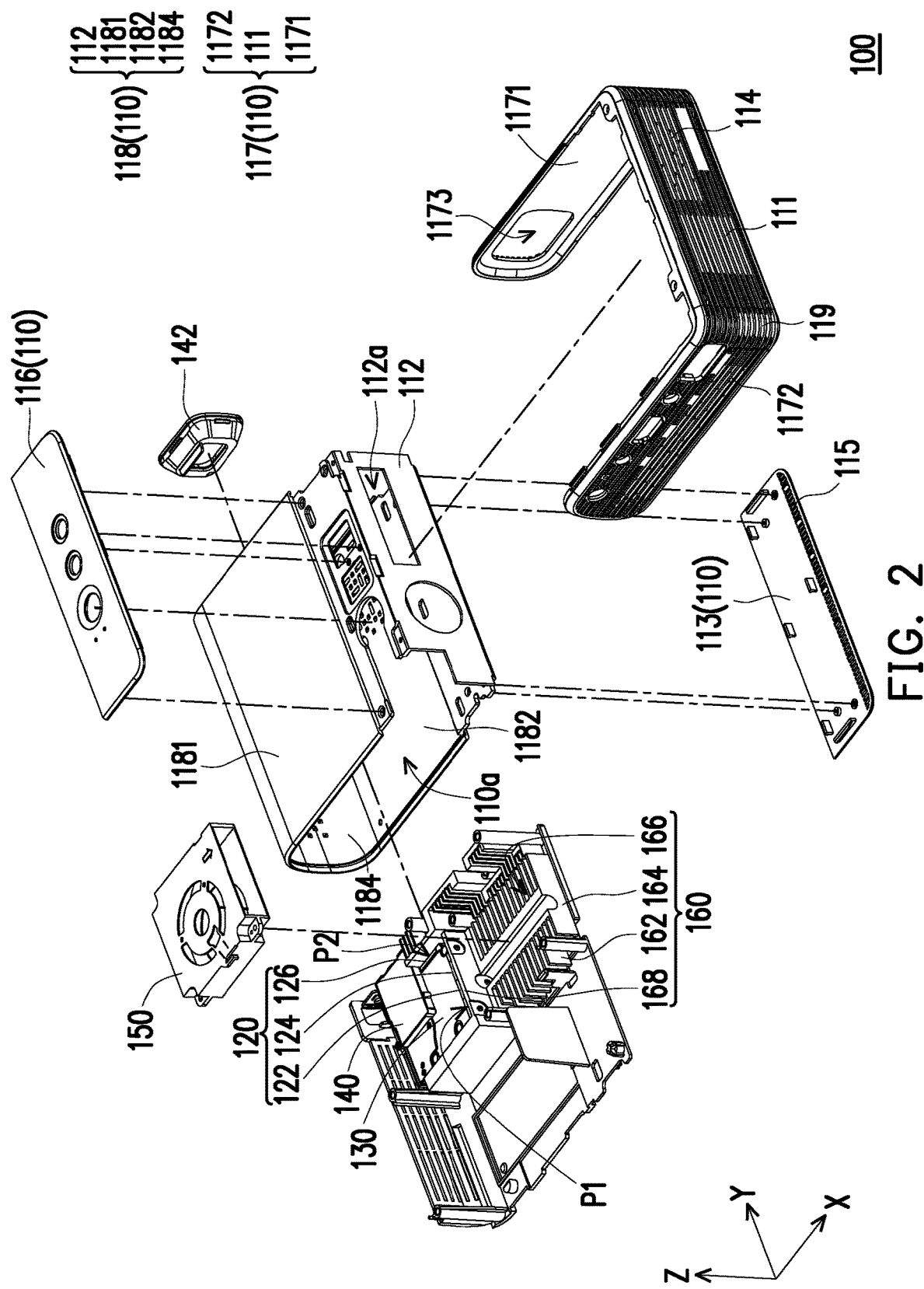
FIG. 2 is a perspective exploded view of the projection device of FIG. 1.
Figure 3:
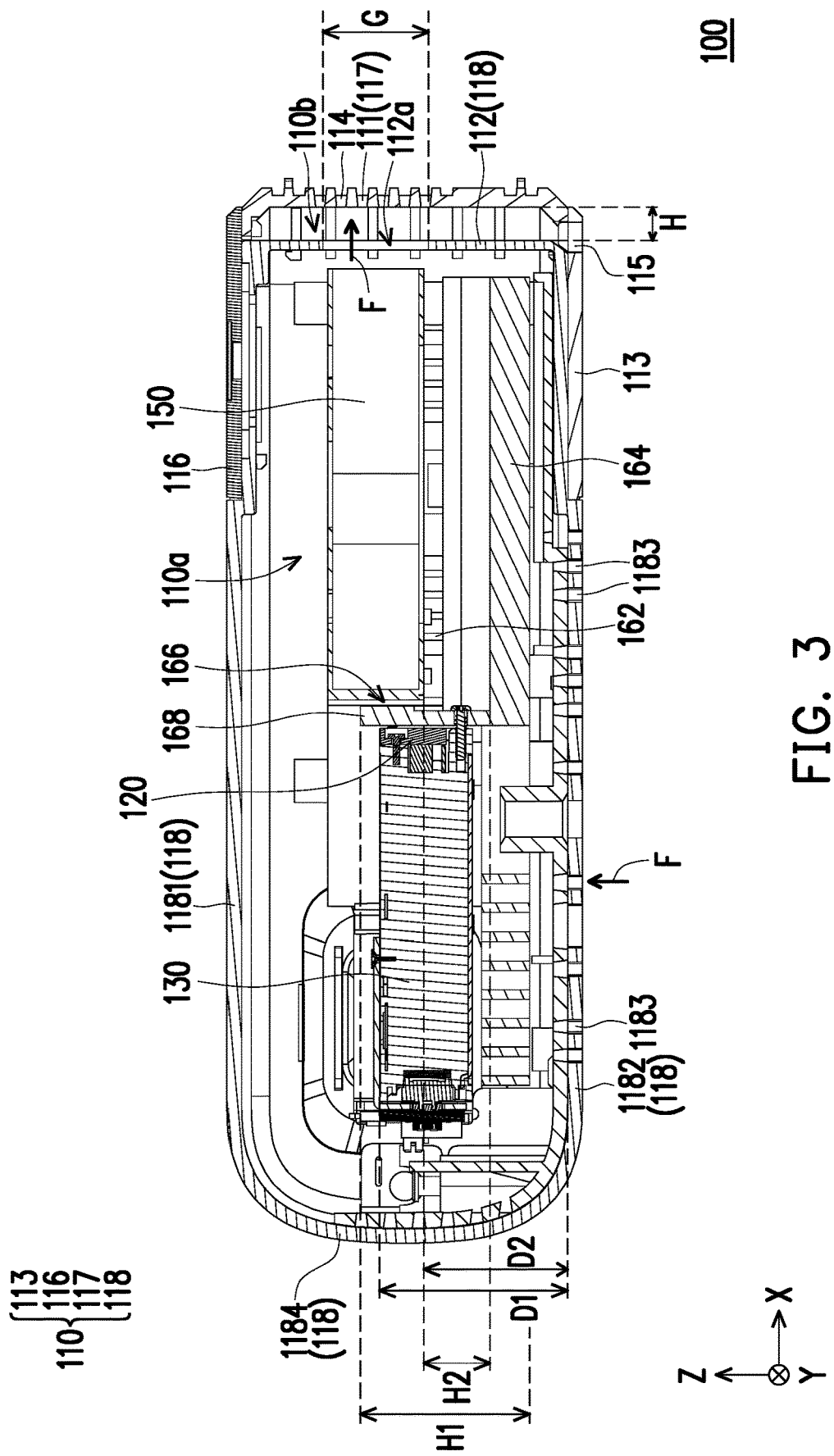
FIG. 3 is a cross-sectional view of the projection device of FIG. 1 taken along a section line A-A.
Figure 4:
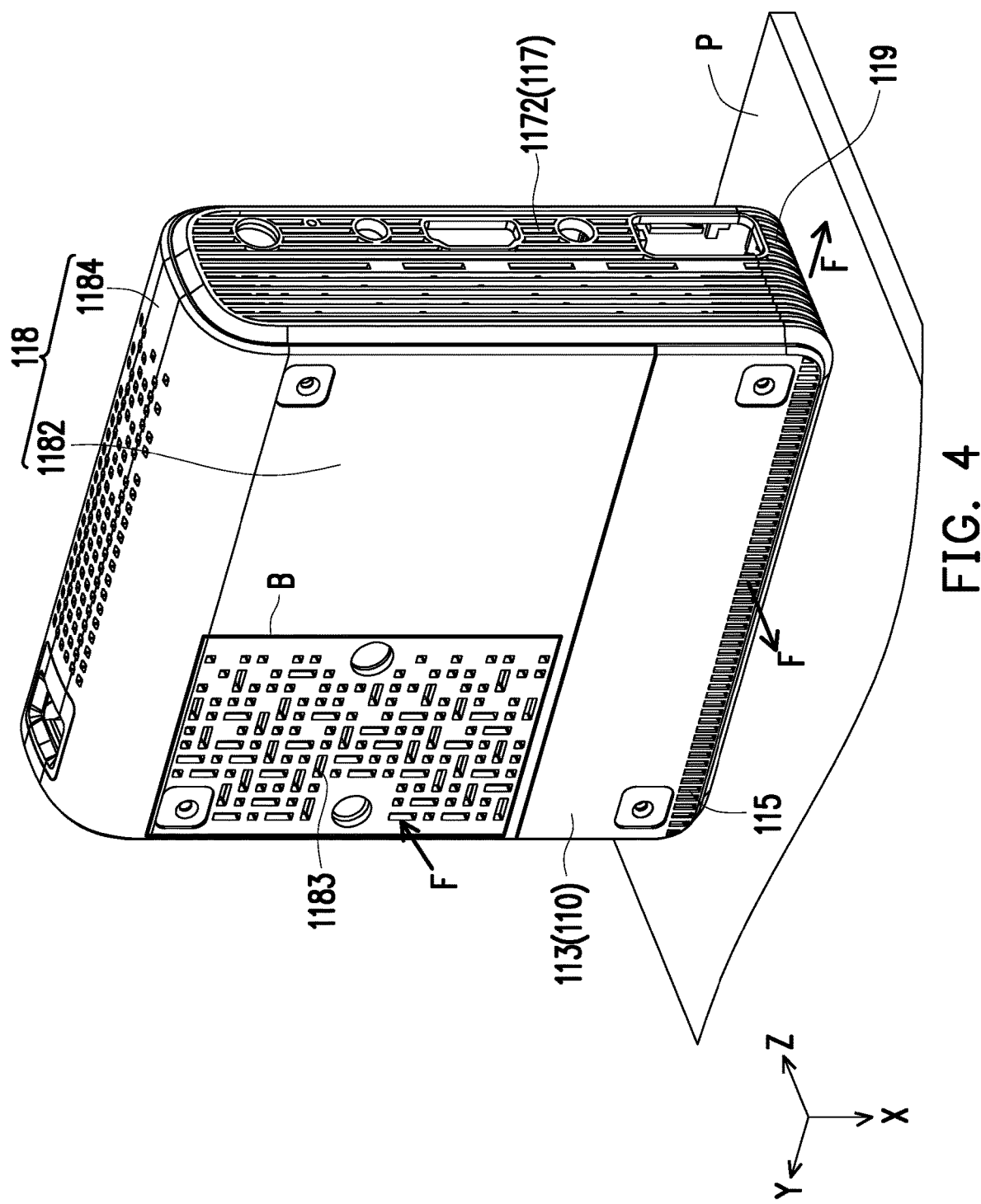
FIG. 4 is a perspective view of the projection device of FIG. 1 placed in another state.
Figure 5:
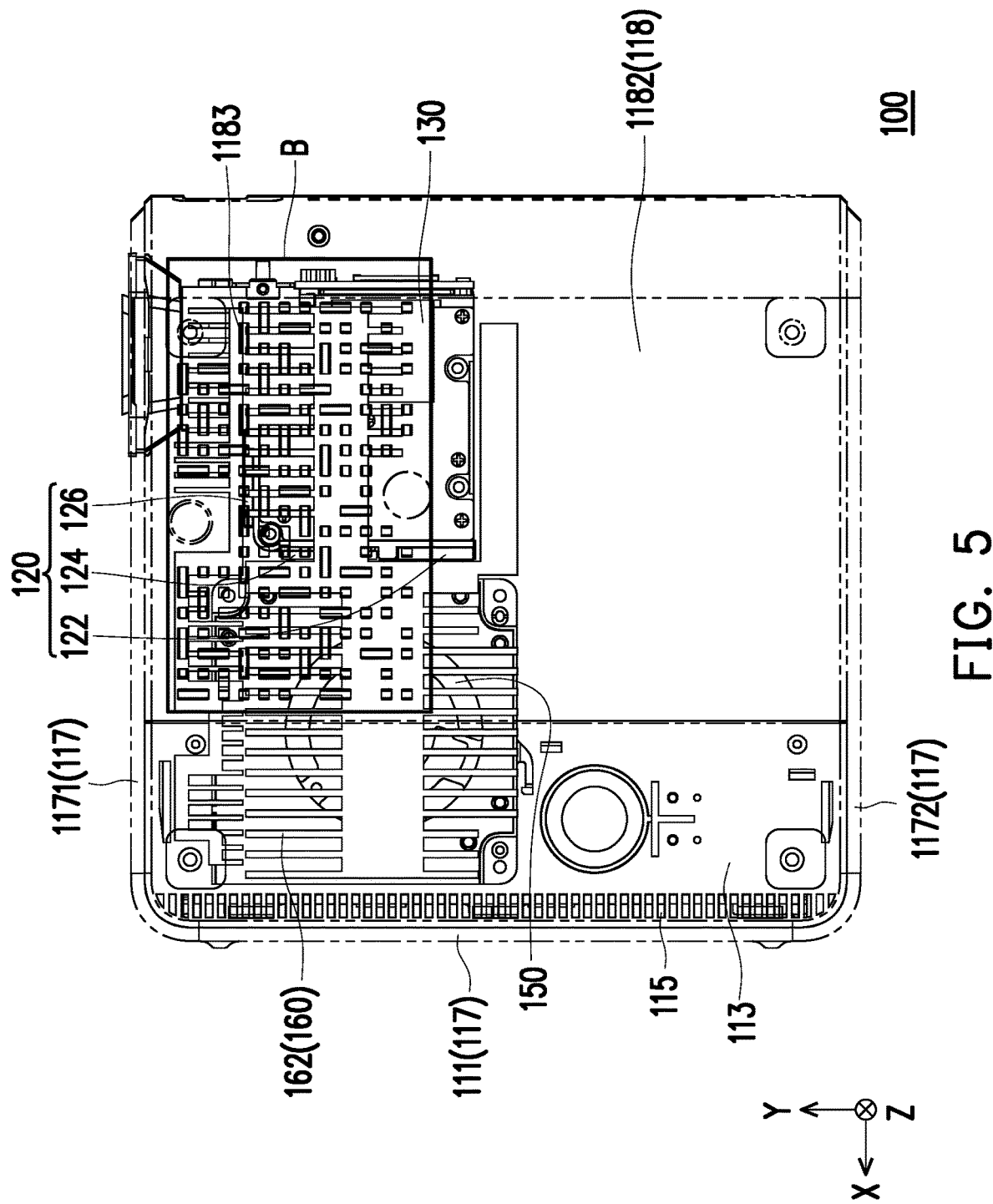
FIG. 5 is a bottom perspective view of the projection device of FIG. 1.

FIG. 1 is a perspective view of a projection device according to an embodiment of the disclosure. FIG. 2 is a perspective exploded view of the projection device of FIG. 1. FIG. 3 is a cross-sectional view of the projection device of FIG. 1 taken along a section line A-A. FIG. 4 is a perspective view of the projection device of FIG. 1 placed in another state. FIG. 5 is a bottom perspective view of the projection device of FIG. 1. For the purpose of facilitating description, a casing 110 is represented by dotted lines in FIG. 5, and an area B in FIG. 4 corresponds to the area B in FIG. 5.

With reference to FIG. 1 to FIG. 3, in this embodiment, a projection device 100 includes the casing 110, a light source module 120, an optical engine module 130, a projection lens 140, and a fan 150. The casing 110 includes a right cover plate 111 and a baffle 112 opposite to each other and a lower cover plate 113 adjacent to the right cover plate 111. The baffle 112 divides the casing 110 into a first area 110a and a second area 110b. The right cover plate 111 has a first air outlet 114, and the lower cover plate 113 has a second air outlet 115. The first air outlet 114 and the second air outlet 115 are adjacent to each other and are located in the second area 110b. The light source module 120, the optical engine module 130, the projection lens 140, and the fan 150 are disposed in the first area 110a of the casing 110. The optical engine module 130 is located on a light transmission path of the light source module 120. The projection lens 140 is connected to the optical engine module 130, and the fan 150 is adjacent to the baffle 112.

Furthermore, as shown in FIG. 2, the casing 110 further includes an upper cover plate 116, a side cover plate 117, and an outer cover plate 118. The side cover plate 117 includes a front cover plate 1171 and a rear cover plate 1172 opposite to each other, and the right cover plate 111 connecting the front cover plate 1171 and the rear cover plate 1172. In addition, the front cover plate 1171, the rear cover plate 1172, and the right cover plate 111 of this embodiment are integrally formed. In this embodiment, the front cover plate 1171 forms an opening 1173, and the projection lens 140 has a mirror cover 142 corresponding to the opening 1173. The mirror cover 142 is disposed in the opening 1173, and the projection lens 140 projects an image beam through the opening 1173. In addition, the projection lens 140, for example, projects the image beam along a direction of a Y axis in FIG. 2. The outer cover plate 118 includes a top cover plate 1181 and a bottom cover plate 1182 opposite to each other and a left cover plate 1184 and the baffle 112 opposite to each other and connecting the top cover plate 1181 and the bottom cover plate 1182. In addition, the top cover plate 1181, the bottom cover plate 1182, the left cover plate 1184, and the baffle 112 of this embodiment are integrally formed. The side cover plate 117 is assembled on the outer cover plate 118, so that the baffle 112 connects the front cover plate 1171 and the rear cover plate 1172 and is adjacent to the right cover plate 111. The upper cover plate 116 and the lower cover plate 113 are respectively assembled on the top cover plate 1181 and the bottom cover plate 1182, and are connected to the baffle 112. In this embodiment, the casing 110 has better convenience in assembly, and corners of the casing 110 may be designed as rounded to not only be good looking but also ensure better safety.

With reference to FIG. 3, FIG. 4, and FIG. 5 together, in this embodiment, the bottom cover plate 1182 has an air inlet 1183, located in the first area 110a, and an airflow F is configured to flow in from the air inlet 1183 of the bottom cover plate 1182. In this embodiment, an orthographic projection of the light source module 120 and the optical engine module 130 on the bottom cover plate 1182 at least partially overlaps the air inlet 1183. In this way, the airflow F flowing in from the air inlet 1183 may directly flow to the light source module 120 and the optical engine module 130 for performing heat dissipation to the light source module 120 and the optical engine module 130 at the same time, in order to simultaneously solve the heat dissipation problem of the main heat source.

With reference to FIG. 2 and FIG. 3 again, in this embodiment, the projection device 100 further includes a heat dissipation module 160, disposed between the fan 150 and the air inlet 1183 of the bottom cover plate 1182. The heat dissipation module 160 includes a heat dissipation fin component 162 and a heat dissipation column 164. The heat dissipation fin component 162 forms an accommodation space 166, and the fan 150 is disposed in the accommodation space 166. In this embodiment, the fan 150 is, for example, a blower fan, and the heat dissipation column 164 corresponds to a center of the fan 150. Since the exhaust air volume at the center of the fan 150 is relatively small, in order to maintain a good airflow rate at the heat dissipation fin component 162 for heat dissipation, the heat dissipation column 164 of the heat dissipation module 160 having less influenced heat dissipation efficiency is disposed opposite to the center of the fan 150. In addition, in this embodiment, the heat dissipation column 164 is disposed in a direction (for example, a direction of an X axis in FIG. 2 and FIG. 3) perpendicular to a light exit direction of the projection lens 140 (for example, the direction of the Y axis in FIG. 2 and FIG. 3). As shown in FIG. 3, in this embodiment, a first distance D1 from the optical engine module 130 to the bottom cover plate 1182 is greater than a second distance D2 from the heat dissipation module 160 to the bottom cover plate 1182. Therefore, flow resistance below the optical engine module 130 is relatively small, so that a relatively great amount of airflow may effectively cool the heat dissipation module 160 when flowing into the bottom cover plate 1182, thereby improving overall heat dissipation performance of the projection device 100.

Furthermore, as shown in FIG. 2, the light source module 120 of this embodiment includes a first light source module 122, a second light source module 124, and a third light source module 126. The first light source module 122 is, for example, a red light-emitting diode (LED) component, the second light source module 124 is, for example, a green LED component, and the third light source module 126 is, for example, a blue LED component. The first light source module 122 and the second light source module 124 are located on a first plane P1 and are close to a base 168 of the heat dissipation module 160, and the third light source module 126 is located on a second plane P2 perpendicular to the first plane P1. In this way, the first light source module 122 and the second light source module 124 located on the same first plane P1 may share a heat dissipation system. As shown in FIG. 3, a first height H1 of the base 168 is greater than a second height H2 of the heat dissipation fin component 162, and the fan 150 is located above the heat dissipation fin component 162 and on a side of the base 168. In this way, elements in the projection device 100 may be configured to be flattened for effectively using the space, so that the volume of the projection device 100 may be effectively reduced.

With reference to FIG. 1 and FIG. 2 again, in this embodiment, a connection corner of the right cover plate 111 and the rear cover plate 1172 has a third air outlet 119, and the third air outlet 119 communicates with the first air outlet 114. The third air outlet 119 may provide an additional air outlet path to further improve the heat dissipation performance of the projection device 100. However, the disclosure is not limited to the above. In other embodiments, hot airflow may be discharged only through the first air outlet 114 and the second air outlet 115 without disposing the third air outlet 119. In addition, the third air outlet 119 may also extend to the rear cover plate 1172. In this embodiment, the area of the second air outlet 115 plus the area of the third air outlet 119 is less than the area of the first air outlet 114. Therefore, the distance between the first air outlet 114 and the baffle 112 is not too long, so that the hot airflow may be effectively discharged. In addition, space occupied by the second area 110b is reduced to avoid the overall volume of the projection device 100 from being too large.

With reference to FIG. 2 and FIG. 3, in this embodiment, the baffle 112 divides the casing 110 into the first area 110a and the second area 110b. The area of the first area 110a is greater than the area of the second area 110b, and no heating element or optical element is disposed in the second area 110b. It should be noted that in this embodiment, the baffle 112 substantially extends in a direction parallel to the right cover plate 111. However, in other embodiments, the baffle 112 may not be parallel to the right cover plate 111, or the baffle 112 may also have multiple sections parallel to the right cover plate 111, and the distances between each section and the right cover plate 111 may be different. Furthermore, the baffle 112 of this embodiment has an opening 112a, and is disposed in correspondence with an air outlet of the fan 150. The fan 150 may guide the airflow F from the first area 110a to the second area 110b through the opening 112a, and the second area 110b may serve as an air outlet channel to guide the airflow F for discharge. In this embodiment, the opening 112a is only disposed in correspondence with the air outlet of the fan 150, so the airflow F does not flow back from the second area 110b to the first area 110a. In addition, a horizontal distance H from the baffle 112 to the right cover plate 111 of this embodiment is less than or equal to a maximum pore size G of the opening 112a. In other words, the baffle 112 is adjacent to the first air outlet 114 of the right cover plate 111, so the airflow F may be quickly discharged from the first air outlet 114 after passing through the opening 112a of the baffle 112. Furthermore, in this embodiment, the airflow F may be discharged from the first air outlet 114 substantially along the direction of the X axis in FIG. 2 and FIG. 3.

With reference to FIG. 1 and FIG. 4 together, the projection device 100 of this embodiment is configured to be placed in a first state or a second state. In this embodiment, the first state is embodied as a horizontal state as shown in FIG. 1, and the second state is embodied as a vertical state as shown in FIG. 4.

With reference to FIG. 1 and FIG. 3 together, when the projection device 100 is placed in the first state, the first air outlet 114 and the third air outlet 119 are located on the side of the projection device 100, and the second air outlet 115 is located at the bottom of the projection device 100. After entering the second area 110b through the opening 112a, the airflow F flows out from the unobstructed first air outlet 114 and the third air outlet 119. With reference to FIG. 3 and FIG. 4 together, when the projection device 100 is placed in the second state, the first air outlet 114 is located at the bottom of the projection device 100 and may be blocked by a desktop P, but the second air outlet 115 and the third air outlet 119 are located on the side of the projection device 100. The second area 110b may serve as the air outlet channel. After entering the second area 110b through the opening 112a, the airflow F is configured to pass through the air outlet channel and flow out from the unobstructed second air outlet 115 and the third air outlet 119. Furthermore, in the embodiment of FIG. 4, the airflow F discharged from the second air outlet 115 may substantially flow along an opposite direction of a Z axis in FIG. 4, and the airflow F discharged from the third air outlet 119 may substantially flow along an opposite direction of the Y axis in FIG. 4. In this way, the projection device 100 of this embodiment may have an unobstructed air outlet in various placement states, and may effectively perform heat dissipation to have better convenience in operation and flexibility in use.

In short, the baffle 112, the first air outlet 114 of the right cover plate 111, and the second air outlet 115 of the lower cover plate 113 in this embodiment are designed for the projection device 100 of this embodiment to be used in horizontal applications and be supported without any external mounting part, or be directly used in vertical applications without limiting the distances of the air outlet and the air inlet. The hot air that has cooled down the elements in the system is extracted by the fan 150, and then enters the airflow channel (i.e. the second area 110b) formed between the baffle 112 and the side cover plate 117 to be discharged out of the projection device 100. Therefore, the projection device 100 of this embodiment is adapted to be applied in various situations and has better convenience and flexibility in use.

In summary, the embodiments of the disclosure have at least one of the following effects. In the design of the projection device of the disclosure, the baffle divides the casing into the first area and the second area. The first air outlet and the second air outlet are adjacent to each other and are located in the second area. The light source module, the optical engine module, the projection lens, and the fan are disposed in the first area of the casing. The projection device is configured to be placed in one of the first state and the second state, and the hot airflow in the projection device is configured to flow out from one of the first air outlet and the second air outlet. In this way, the projection device has an unobstructed air outlet in various placement states, and may effectively perform heat dissipation to have better convenience in operation and flexibility in use.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A projection device, comprising a casing, a light source module, an optical engine module, a projection lens, and a fan, wherein the casing comprises a right cover plate and a baffle opposite to each other and a lower cover plate adjacent to the right cover plate, the baffle divides the casing into a first area and a second area, the right cover plate has a first air outlet, the lower cover plate has a second air outlet, and the first air outlet and the second air outlet are adjacent to each other and are located in the second area;

the light source module, the optical engine module, the projection lens, and the fan are disposed in the first area of the casing, the optical engine module is located on a light transmission path of the light source module, the projection lens is connected to the optical engine module, and the fan is adjacent to the baffle; and the projection device is configured to be placed in one of a first state and a second state, and hot airflow in the projection device is configured to flow out from one of the first air outlet and the second air outlet;

wherein the casing further comprises a side cover plate, and an outer cover plate, the side cover plate comprises a front cover plate and a rear cover plate opposite to each other and the right cover plate connecting the front cover plate and the rear cover plate, the outer cover plate comprises a top cover plate and a bottom cover plate opposite to each other and the left cover plate and the baffle opposite to each other and connecting the top cover plate and the bottom cover plate, the side cover plate is assembled on the outer cover plate so that the baffle connects the front cover plate and the rear cover plate and is adjacent to the right cover plate.

2. The projection device according to claim 1, wherein the casing further comprises an upper cover plate, the upper cover plate and the lower cover plate are respectively assembled on the top cover plate and the bottom cover plate and are connected to the baffle, the front cover plate forms an opening, and the projection lens projects an image beam through the opening.

3. The projection device according to claim 2, wherein the front cover plate, the rear cover plate, and the right cover plate are integrally formed.

4. The projection device according to claim 2, wherein the top cover plate, the bottom cover plate, the left cover plate, and the baffle are integrally formed.

5. The projection device according to claim 2, wherein the bottom cover plate has an air inlet, located in the first area, and an orthographic projection of the light source module and the optical engine module on the bottom cover plate partly overlaps the air inlet.

6. The projection device according to claim 5, further comprising:

a heat dissipation module, disposed between the fan and the air inlet of the bottom cover plate.

7. The projection device according to claim 6, wherein a first distance from the optical engine module to the bottom cover plate is greater than a second distance from the heat dissipation module to the bottom cover plate.

8. The projection device according to claim 6, wherein the heat dissipation module comprises a heat dissipation fin component and a heat dissipation column, the heat dissipation fin component forms an accommodation space, the fan is disposed in the accommodation space, and the heat dissipation column corresponds to a center of the fan.

9. The projection device according to claim 8, wherein the heat dissipation column is disposed in a direction perpendicular to a light exit direction of the projection lens.

10. The projection device according to claim 6, wherein the light source module comprises a first light source module, a second light source module, and a third light source module, the first light source module and the second light source module are located on a first plane and are adjacent to the heat dissipation module, and the third light source module is located on a second plane perpendicular to the first plane.

11. The projection device according to claim 10, wherein the first light source module is a red light-emitting diode component, the second light source module is a green light-emitting diode component, and the third light source module is a blue light-emitting diode component.

12. The projection device according to claim 2, wherein a connection corner of the right cover plate and the rear cover plate has a third air outlet, and the third air outlet communicates with the first air outlet.

13. The projection device according to claim 12, wherein the first state is a horizontal state, and the hot airflow in the projection device flows out from the first air outlet and the third air outlet.

14. The projection device according to claim 12, wherein the second state is a vertical state, and the hot airflow in the projection device flows out from the second air outlet and the third air outlet.

15. The projection device according to claim 12, wherein an area of the second air outlet plus an area of the third air outlet is less than an area of the first air outlet.

16. The projection device according to claim 1, wherein the baffle has an opening, and the opening of the baffle is disposed in correspondence with an air outlet of the fan.

17. The projection device according to claim 16, wherein a horizontal distance from the baffle to the right cover plate is less than or equal to a maximum pore size of the opening.

18. The projection device according to claim 1, wherein the fan comprises a blower fan.

19. The projection device according to claim 1, wherein an area of the first area is greater than an area of the second area.

20. The projection device according to claim 1, wherein no heating element or optical element is disposed in the second area.

* * * * *